US012744296B2

(12) United States Patent
Snygg et al.

(10) Patent No.: US 12,744,296 B2
(45) Date of Patent: Sep. 22, 2026

(54) WAVEGUIDE INTERFACE FOR COUPLING A WAVEGUIDE TO A MICROWAVE CONDUCTOR ON A PCB AND INCLUDING A BACKSHORT DIELECTRIC BEING THE SAME AS A DIELECTRIC OF THE PCB

(71) Applicant: Telefonaktiebolaget LM Ericsson (publ), Stockholm (SE)

(72) Inventors: Göran Snygg, Partille (SE); Martin Fagerström, Bollebygd (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 324 days.

(21) Appl. No.: 18/011,849

(22) PCT Filed: Jun. 22, 2020

(86) PCT No.: PCT/SE2020/050640
§ 371 (c)(1),
(2) Date: Dec. 21, 2022

(87) PCT Pub. No.: WO2021/262044
PCT Pub. Date: Dec. 30, 2021

(65) Prior Publication Data
US 2023/0268632 A1 Aug. 24, 2023

(51) Int. Cl.
*H01P 5/107* (2006.01)
*H05K 1/02* (2006.01)

(52) U.S. Cl.
CPC .......... *H01P 5/107* (2013.01); *H05K 1/0237* (2013.01); *H05K 2201/0969* (2013.01)

(58) Field of Classification Search
CPC ...................................................... H01P 5/107
(Continued)

(56) References Cited

U.S. PATENT DOCUMENTS 6,239,669 B1 5/2001 Koriyama et al.
7,019,600 B2 * 3/2006 Shono .................... H01P 5/107 333/33

(Continued)

FOREIGN PATENT DOCUMENTS

JP 2007013450 A 1/2007
WO WO 2019/199212 A1 10/2019
WO WO 2020/177843 A1 9/2020

OTHER PUBLICATIONS

International Search Report and Written Opinion of the International Searching Authority, PCT/SE2020/050640, mailed Mar. 29, 2021, 13 pages.

(Continued)

*Primary Examiner* — Benny T Lee
(74) *Attorney, Agent, or Firm* — Sage Patent Group

(57) ABSTRACT

Provided is a waveguide interface arrangement for electrically connecting a waveguide device to a microwave conductor that runs in a metallization on one main side of a printed circuit board, PCB, comprising a PCB dielectric layer, a first PCB main side with a first PCB metallization and a first PCB aperture in the first PCB metallization, and a second PCB main side with a second PCB metallization and a second PCB aperture in the second PCB metallization. The first PCB aperture corresponds to a waveguide aperture and a backshort is attached to the second PCB main side, comprising a backshort dielectric layer, a first backshort main side with a first backshort metallization.
The second backshort metallization is electrically connected to the second PCB metallization.
The backshort aperture is adapted to face the second PCB aperture.

20 Claims, 5 Drawing Sheets

(58) Field of Classification Search
USPC .......................................................... 333/26
See application file for complete search history.

(56) References Cited

U.S. PATENT DOCUMENTS

2006/0097819 A1* 5/2006 Lo Hine Tong et al. .................... H01P 5/107 333/26
2006/0255875 A1 11/2006 Kenichi
2007/0182505 A1 8/2007 Fujita et al.
2012/0256707 A1 10/2012 Leiba et al.
2015/0054593 A1 2/2015 Wang
2017/0301975 A1 10/2017 Flatters et al.
2019/0207286 A1 7/2019 Moallem
2019/0311998 A1 10/2019 Daijiro
2021/0151849 A1* 5/2021 Sten ..................... H05K 1/0225

OTHER PUBLICATIONS

Sakakibara, K., et al., "Broadband and Planar Microstrip-to-Waveguide Transitions in Millimeter-Wave-Band," 2008 International Conference on Microwave and Millimeter Wave Technology, Apr. 21-24, 2008, Nanjing, China, 4 pages.
European Search Report dated Feb. 21, 2024 for European Patent Application No. 20942173.4, p. 11.

* cited by examiner

WAVEGUIDE INTERFACE FOR COUPLING A WAVEGUIDE TO A MICROWAVE CONDUCTOR ON A PCB AND INCLUDING A BACKSHORT DIELECTRIC BEING THE SAME AS A DIELECTRIC OF THE PCB

CROSS REFERENCE TO RELATED APPLICATIONS

This application is a 35 U.S.C. § 371 national stage application of PCT International Application No. PCT/US2020/050640 filed on Jun. 22, 2020, the disclosure and content of which is incorporated by reference herein in its entirety.

TECHNICAL FIELD

The present disclosure relates to wireless communication systems, and in particular to a waveguide interface arrangement adapted for electrically connecting a waveguide interface to a microwave conductor.

BACKGROUND

In many fields of wireless communication, such as microwave communication, as well as for applications associated with radars and other sensors using microwave technology, waveguides are used for transporting wireless signals, due to the low losses incurred in a waveguide.

In many applications, microwave radios are using waveguides as interface to antennas. Therefore, it is common to use a microstrip to waveguide transition in the design. This transition is normally designed around a printed circuit board (PCB) where there is a waveguide port on one side of the PCB and a so called "backshort" on the other side, where the backshort is used for reflecting the wave back through the waveguide port. Traditionally a backshort is a mechanical part, made in a metal, and which is pushed against the PCB with springs, screws or similar devices. There could also be electrical gaskets in the interfaces to minimize potential leakages. For some applications conductive glue and soldering can be used.

There are certain obstacles with the existing backshort solutions, for example leakage, cost and thermal mismatch.

Leakage drives the tolerances and complexity of the interfaces, and relatively high manufacturing costs are due to tolerance requirements and complexity. Thermal mismatch occur, and in particular if the backshort is glued or soldered to the PCB. The PCB material is made of combination of plastic and glass fiber and the backshort is made in metal. This will of course cause a thermal mismatch that is difficult to handle in products that are exposed to large temperature variations such as outdoor products.

There is thus a need for an improved waveguide transition arrangement adapted for electrically connecting a waveguide interface to a microwave conductor, where the above drawbacks are minimized.

SUMMARY OF THE INVENTION

It is an object of the present disclosure to provide an improved waveguide transition arrangement adapted for electrically connecting a waveguide interface to a microwave conductor.

The object is obtained by means of a waveguide interface arrangement arranged for electrically connecting a waveguide device to a microwave conductor, where the microwave conductor is positioned/implemented in a metallization on one main side of a printed circuit board (PCB). The PCB comprises a PCB dielectric layer, a first PCB main side with a first PCB metallization and a first PCB aperture in the first PCB metallization. The PCB further comprises a second PCB main side with a second PCB metallization and a second PCB aperture in the second PCB metallization. At least one electronic component is mounted to a PCB metallization and the first PCB main side is adapted for attachment of a waveguide device, where the first PCB aperture is adapted to correspond to a waveguide aperture. The waveguide interface arrangement further comprises a backshort that is attached to the second PCB main side. The backshort comprises a backshort dielectric layer, a first backshort main side with a first backshort metallization, and a second backshort main side with a second backshort metallization and a backshort aperture in the second backshort metallization. The backshort metallizations are electrically connected to each other, and the first backshort metallization covers a main part of the first backshort main side. The second backshort metallization is electrically connected to the second PCB metallization, and the backshort aperture is adapted to face the second PCB aperture.

The above arrangement provides a low cost and high performance solution for a waveguide interface arrangement that minimizes reliability problems. A potential leakage path can be avoided. Therefore, the production process will be simplified since the backshort can be mounted in a standard SMD process without screws and springs. Overall, the cost for the backshort will be reduced significantly.

According to some aspects, the dielectric layers are made in the same dielectric material.

Using the same material in the dielectric layers minimizes reliability problems, in particular problems due to thermal mismatch between materials.

According to some aspects, the main sides are parallel to each other.

The above solution provides a compact and inexpensive design, allowing standard PCB materials to be used.

According to some aspects, the backshort dielectric layer is homogenous and the backshort main sides are arranged opposite to each other.

Such a backshort can easily be implemented in a PCB production process and therefore can be very inexpensive. Furthermore, the size of the backshort will be relatively small as the physical dimensions decrease with the dielectric constant of the dielectric material used for the backshort.

According to some aspects, the backshort dielectric layer comprises an air-filled cavity that communicates with the backshort aperture. The cavity is defined by the first backshort main side and cavity walls extending between the first backshort main side and the backshort aperture.

Therefore, having an air-filled cavity provides minimal dielectric losses.

According to some aspects, the backshort metallizations are electrically connected to each other by means of at least partly metalized cavity walls extending between the first backshort main side and the backshort aperture.

According to some aspects, the backshort metallizations are electrically connected to each other by means of via connections.

Hence, according to the above-mentioned aspects, either fences or metalized surfaces can be used for creating electrical walls.

According to some aspects, the microwave conductor is either formed in the first PCB metallization or in the second PCB metallization. In the latter case, the microwave conductor is adapted to enter the backshort via an opening in the second backshort metallization.

The waveguide interface arrangement is thus independent of the side on which the microwave conductor is positioned.

According to some aspects, the microwave conductor comprises a radiating element at an end thereof.

The above arrangement enables tuning of the waveguide interface arrangement.

According to some aspects, the PCB metallizations are electrically connected by means of via connections that surround the PCB apertures. Alternatively, the PCB metallizations are electrically connected by means of at least one metalized wall that connects the PCB apertures.

Hence, according to the above-mentioned aspects, either fences or metalized surfaces can be used for creating electrical walls.

According to some aspects, the second backshort metallization is electrically connected to the second PCB metallization by means of soldering.

By soldering the backshort metallization to PCB metallization, the backshort is attached to the PCB in a both mechanically rigid and electrically reliable manner.

This object is also obtained by means of backshorts and methods that are associated with the above advantages.

BRIEF DESCRIPTION OF THE DRAWINGS

The present disclosure will now be described more in detail with reference to the appended drawings, where.

DETAILED DESCRIPTION OF THE INVENTION

Figure 1:
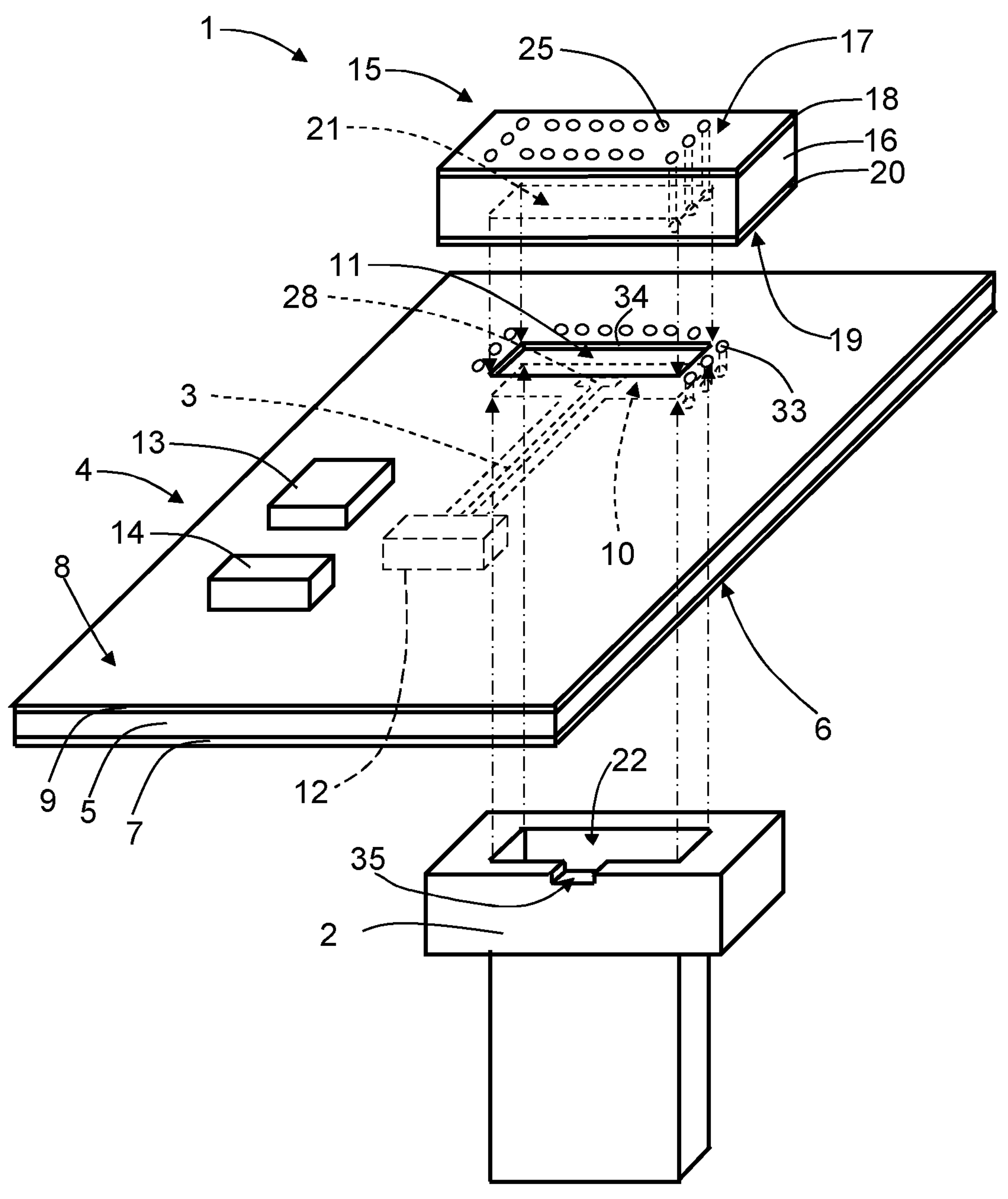
FIG. 1 shows a schematic perspective exploded view of a first example of a waveguide interface arrangement together with a waveguide device.

Aspects of the present disclosure will now be described more fully hereinafter with reference to the accompanying drawings. The different devices, systems and methods disclosed herein can, however, be realized in many different forms and should not be construed as being limited to the aspects set forth herein. Like numbers in the drawings refer to like elements described throughout the detailed description of the drawings.

The terminology used herein is for describing aspects of the disclosure only and is not intended to limit the invention. As used herein, the singular forms “a”, “an” and “the” are intended to include the plural forms as well, unless the context clearly indicates otherwise.

Figure 2:
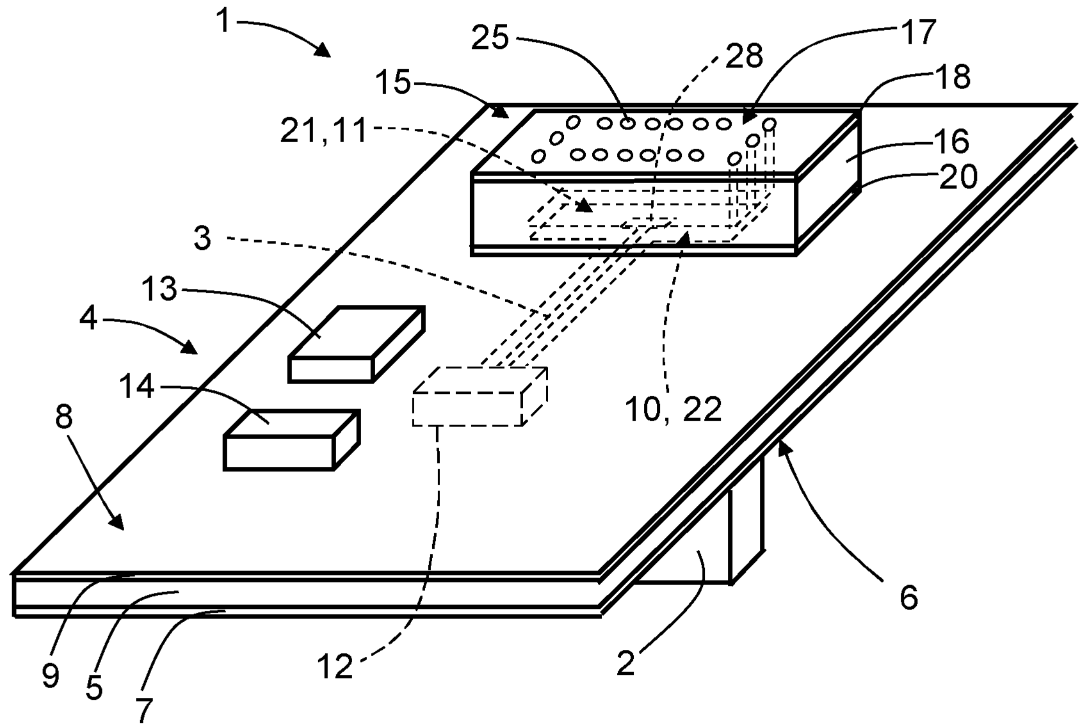
FIG. 2 shows a schematic perspective view of the first example of a waveguide interface arrangement together with a waveguide device.
Figure 3:
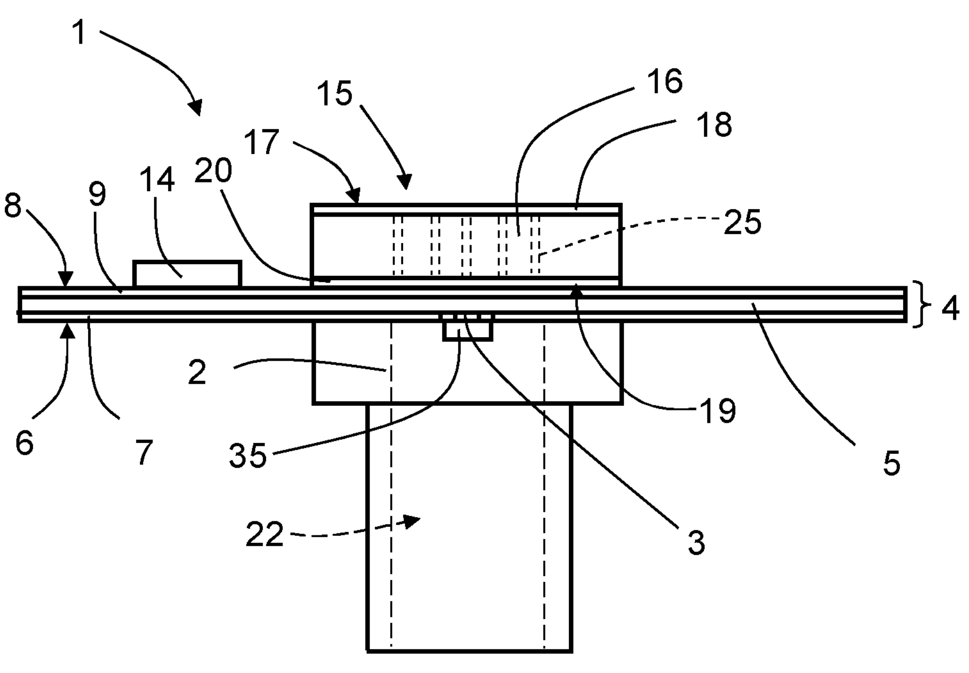
FIG. 3 shows a schematic side view of FIG. 2.

According to a first example, with reference to FIG. 1, showing a schematic perspective exploded view, FIG. 2, showing a schematic perspective view, and FIG. 3, showing a schematic side view, there is a waveguide interface arrangement 1 arranged for electrically connecting a waveguide device 2 to a microwave conductor 3. A printed circuit board 4 (PCB) comprises a PCB dielectric layer 5, a first PCB main side 6 with a first PCB metallization 7 and a first PCB aperture 10 (FIGS. 1 and 2) in the first PCB metallization 7, and a second PCB main side 8 with a second PCB metallization 9 and a second PCB aperture 11 (FIGS. 1 and 2) in the second PCB metallization 9. The PCB metallizations 7, 9 are provided on opposite sides of the PCB dielectric layer 5.

In this example, the microwave conductor 3 is positioned in the first PCB metallization 7, and is in the form of a microstrip conductor, where the second PCB metallization 9 forms a ground plane for the microstrip conductor 3. In this case, the microwave conductor 3 is positioned through an opening 35 (FIGS. 1 and 3) in the waveguide device 2. According to some aspects, the microwave conductor 3 comprises a radiating element 28 (FIGS. 1 and 2) at an end thereof, where the radiating element 28, for example, can be in the form of a rectangular or circular patch element. The radiating element 28 is adapted to enhance the properties of the electrical connection between the waveguide device 2 and the microwave conductor 3, and can be used as a tuning element.

The microwave conductor 3 is connected to another component, for example, at least one electronic component 12 (FIGS. 1 and 2) that is mounted to the first PCB metallization 7, where such a component for example can be a connector, a filter or an amplifier. Generally, at least one electronic component 12, 13, 14 (FIGS. 1 and 2) is mounted to a PCB metallization 7, 9.

The first PCB main side 6 is adapted for attachment of a waveguide device 2, where the first PCB aperture 10 is adapted to correspond to a waveguide aperture 22, as indicated in FIG. 1. According to some aspects, the PCB metallizations 7, 9 are electrically connected by means of via connections 33 (FIG. 1) that surround the PCB apertures 10, 11. For reasons of clarity, the via connections are only shown schematically, and only a few via connections are shown completely by means of hidden contour markings. It is to be understood that a sufficient amount of sufficiently spaced via connections completely surround the PCB apertures 10, 11 and electrically connect the PCB metallizations 7, 9 to each other.

Alternatively, according to some aspect, the PCB metallizations 7, 9 are electrically connected by means of at least one metalized wall 34 (FIG. 1) that connects the PCB apertures 10, 11, the wall being comprised in the PCB dielectric layer 5.

The waveguide interface arrangement 1 further comprises a backshort 15 that is attached to the second PCB main side 8, where the backshort 15 comprises a backshort dielectric layer 16. The backshort 15 further comprises a first backshort main side 17 with a first backshort metallization 18, a second backshort main side 19 (FIGS. 1 and 3) with a second backshort metallization 20 and a backshort aperture 21 in the second backshort metallization 20. The backshort metallizations 18, 20 are provided on opposite sides of the backshort dielectric layer 16.

The backshort metallizations 18, 20 are electrically connected to each other, according to some aspects by means of via connections 25, here the via connections 25 surround the backshort aperture 21. For reasons of clarity, the via connections are only shown schematically, and only a few via connections are shown completely by means of hidden contour markings. It is to be understood that a sufficient amount of sufficiently spaced via connections surround the backshort aperture 21 and electrically connect the backshort metallizations 18, 20 to each other.

The first backshort metallization 18 covers a main part of the first backshort main side 17, where, according to some aspects, the first backshort main side 17 and the second backshort main side 19 run parallel and opposite to each other and form outer main sides of the backshort 15, where the backshort dielectric layer 16 is homogenous. According to some further aspects, all main sides 6, 8, 17, 19 run parallel to each other. The second backshort metallization 20 is electrically connected to the second PCB metallization 9, and the backshort aperture 21 is adapted to face the second PCB aperture 11.

According to some aspects, the dielectric layers 5, 16 are made of the same dielectric material which means that the PCB 4 and the backshort 15 will have the same thermal expansion and retraction properties. This enables soldering or electrical conducting glue to be used as the interface between the backshort 15, 15' (FIGS. 4, 5, and 6) and the PCB 4.

According to some aspects, the second backshort metallization 20 is electrically connected to the second PCB metallization 9 by means of soldering. In this way, the backshort 15 is securely attached to the PCB 4, and the metallizations 9, 20 will be electrically connected to each other in a reliable manner. For example, mounting the backshort 15 to the PCB 4 can be performed in an ordinary pick-and-place process, where other components 12, 13, 14 are mounted to the PCB 4 a well.

Alternatively, electrically conducting glue and/or mechanical attachment means such as screws can be used for attaching the backshort 15 to the PCB 4 in such a way that the metallizations 9, 20 will be electrically connected to each other.

Figure 4:
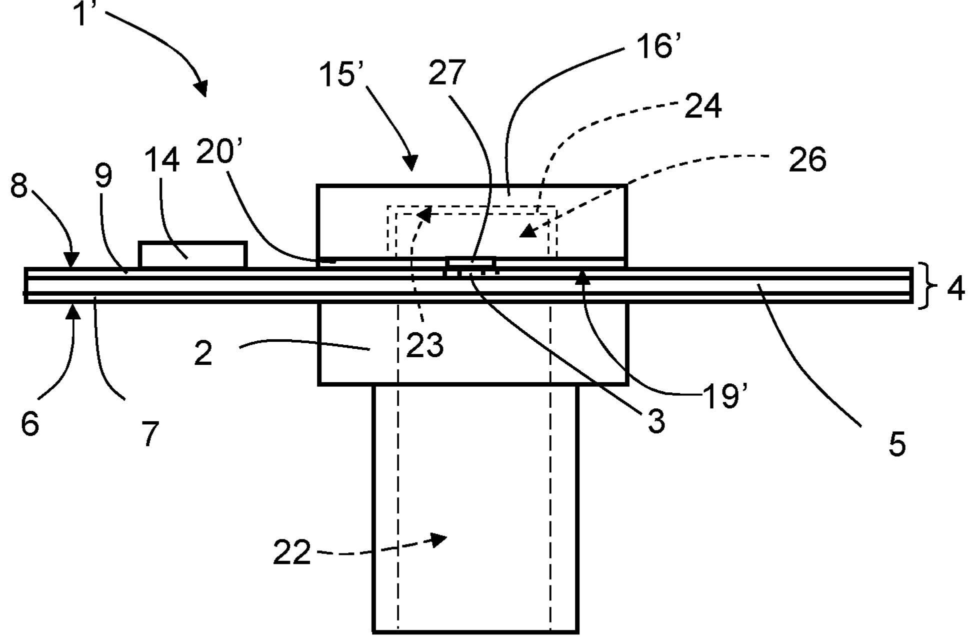
FIG. 4 corresponds to FIG. 3 and illustrates a second example of a waveguide interface arrangement together with a waveguide device.
Figure 5:
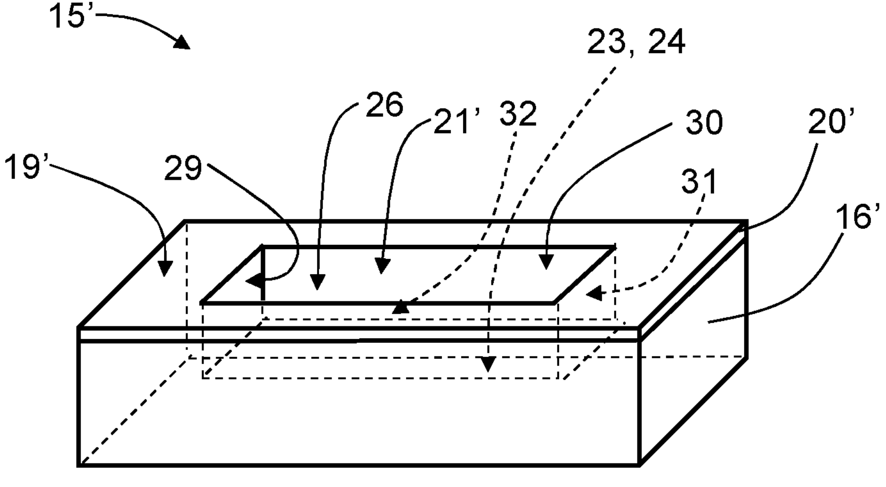
FIG. 5 shows a schematic perspective view of a backshort according to the second example.
Figure 6:
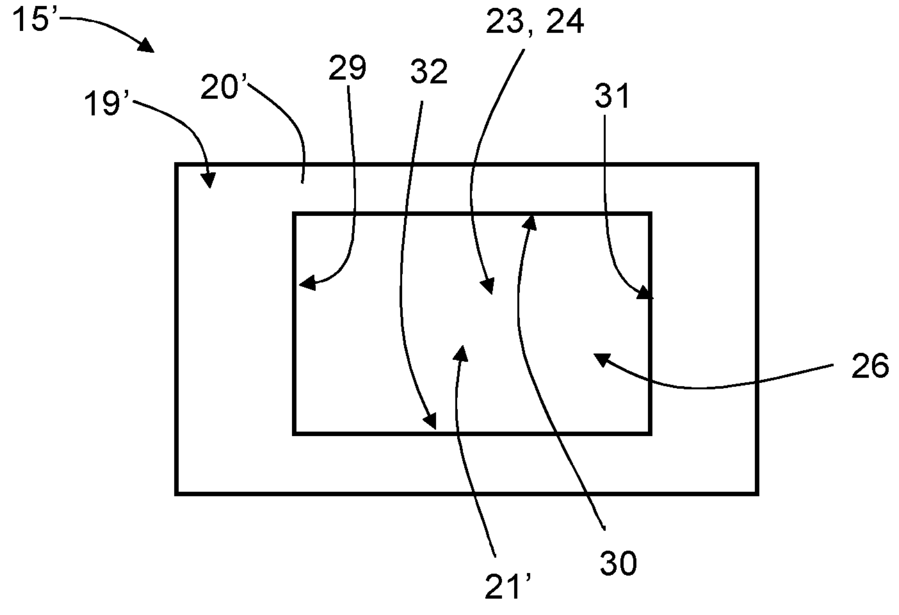
FIG. 6 shows a schematic end side view of the backshort according to the second example.

A second example will now be described with reference to FIG. 4, showing a schematic side view of a waveguide interface arrangement 1' with a waveguide device 2, FIG. 5 showing a perspective side view of a backshort 15' (FIGS. 4-6) and FIG. 6 showing a schematic side view of the backshort 15' (FIGS. 4-6). The PCB 4 is of the same kind as in the first example, except that the microwave conductor 3 is positioned/implemented in the second PCB metallization 9 as shown in FIG. 4; the main difference between the examples lies in how the backshort is formed.

The backshort 15' is attached to the second PCB main side 8, and comprises a backshort dielectric layer 16' as shown in FIG. 4. The backshort 15' further comprises a first backshort main side 23 with a first backshort metallization 24, a second backshort main side 19' with a second backshort metallization 20' and a backshort aperture 21' (FIGS. 5 and 6) in the second backshort metallization 20'. The backshort dielectric layer 16' comprises an air-filled cavity 26 that communicates with the backshort aperture 21', and where the cavity 26 is defined by the first backshort main side 23 and cavity walls 29, 30, 31, 32 extending between the first backshort main side 23 and the backshort aperture 21' (FIGS. 5 and 6). The first backshort main side 23 is here extending within air-filled cavity 26, parallel to the second backshort main side 19', and has a smaller extent than the second backshort main side 19'.

According to some aspects, the backshort metallizations 24, 20' are electrically connected to each other by means of at least partly metalized cavity walls 29, 30, 31, 32 extending between the first backshort main side 23 and the backshort aperture 21' as shown in FIGS. 5 and 6. In this way, a coherent metallization can be formed by the backshort metallizations 24, 20' and the metalized cavity walls 29, 30, 31, 32.

Alternatively, the backshort metallizations 24, 20' are electrically connected to each other by means of via connections in the same way as for the backshort of the first example. As illustrated in FIG. 4, the microwave conductor 3 is formed in the second PCB metallization 9 and is adapted to enter the backshort 15' via an opening 27 in the second backshort metallization 20'.

According to some aspects, the second backshort metallization 20' is electrically connected to the second PCB metallization 9 by means of soldering.

Generally the present disclosure relates to a waveguide interface arrangement 1, 1' arranged for electrically connecting a waveguide device 2 to a microwave conductor 3, where the microwave conductor 3 is positioned/implemented in a metallization 7, 9 on one main side 6, 8 of a printed circuit board 4 (PCB). The PCB comprises comprising a PCB dielectric layer 5, a first PCB main side 6 with a first PCB metallization 7 and a first PCB aperture 10 in the first PCB metallization 7, and a second PCB main side 8 with a second PCB metallization 9 and a second PCB aperture 11 in the second PCB metallization 9. At least one electronic component 12, 13, 14 is mounted to a PCB metallization 7, 9, and the first PCB main side 6 is adapted for attachment of a waveguide device 2, the first PCB aperture 10 being adapted to correspond to a waveguide aperture 22. The waveguide interface arrangement 1, 1' comprises a backshort 15, 15' that is attached to the second PCB main side 8, where the backshort 15, 15' comprises a backshort dielectric layer 16, a first backshort main side 17, 23 with a first backshort metallization 18, 24, and a second backshort main side 19, 19' with a second backshort metallization 20, 20' and a backshort aperture 21, 21' in the second backshort metallization 20, 20'. The backshort metallizations 18, 24; 20, 20' are electrically connected to each other, and the first backshort metallization 18, 24 covers a main part of the first backshort main side 17, 23. Furthermore, the second backshort metallization 20, 20' is electrically connected to the second PCB metallization 9, and the backshort aperture 21, 21' is adapted to face the second PCB aperture 11.

Generally the present disclosure relates to a backshort 15, 15' adapted to be attached to a printed circuit board 4 (PCB) at a main side 8 of the PCB 4 opposite a main side 6 of the PCB 4 where a waveguide device 2 is adapted to be mounted. The backshort 15, 15' comprises a backshort dielectric layer 16, 16', a first backshort main side 17, 23 with a first backshort metallization 18, 24 and a second backshort main side 19, 19' with a second backshort metallization 20, 20' and a backshort aperture 21, 21' in the second backshort metallization 20, 20'. The backshort metallizations 18, 24; 20, 20' are electrically connected to each other and the first backshort metallization 18, 24 covers a main part of the first backshort main side 17, 23.

According to some aspects, tuning of the waveguide interface arrangement 1, 1' can be performed by means of the tuning element 28 (as shown in FIG. 1) and/or by choosing a certain thickness of the backshort dielectric layer 16 16'. According to some aspects, the tuning of the waveguide interface arrangement 1, 1' can also, alone or in combination with any one of the above, be performed by choosing a certain distance that the microwave conductor 3 extends between the backshort 15, 15' and the PCB 4.

Figure 7:
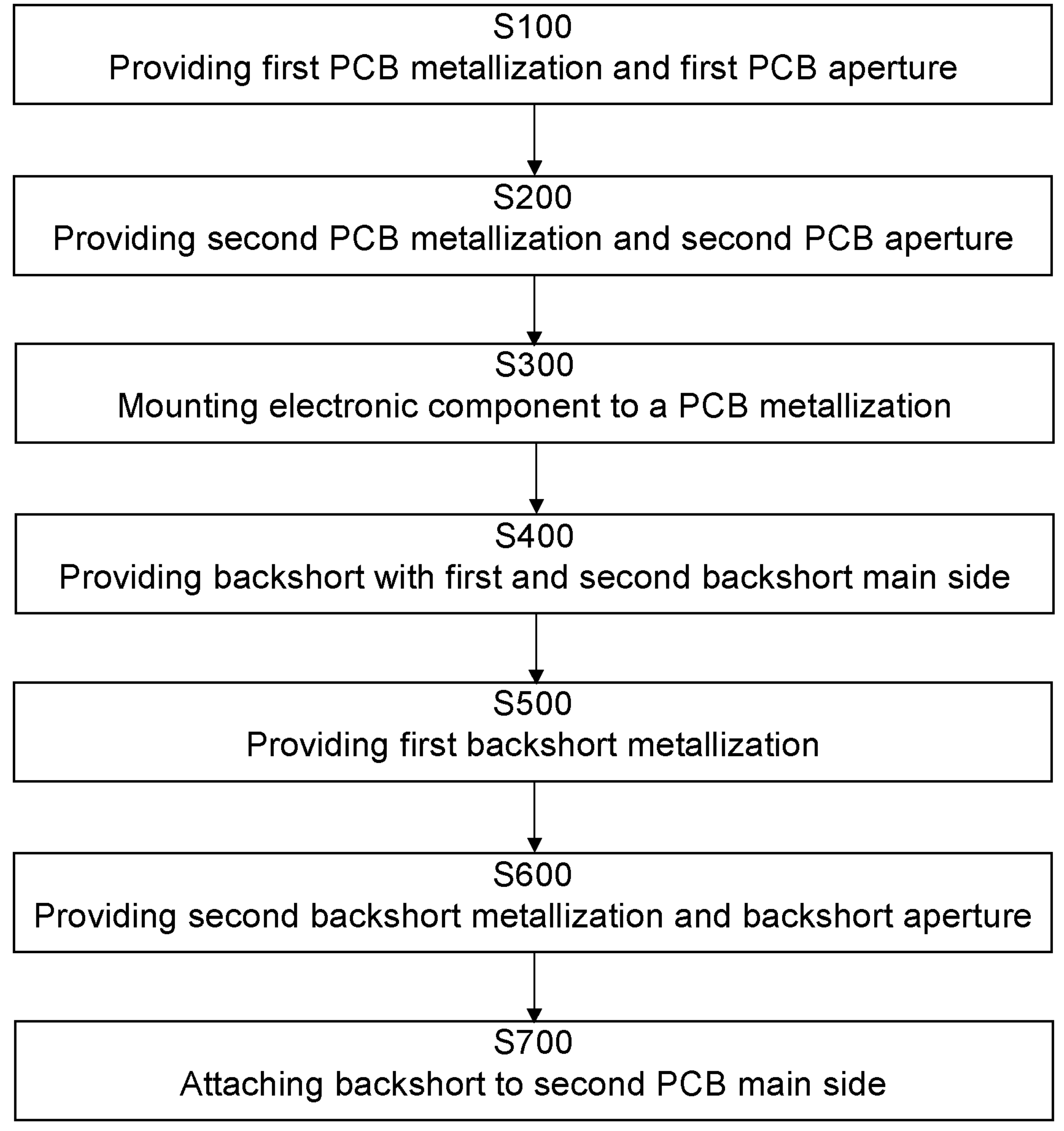
FIG. 7 shows a flowchart for methods according to the present disclosure.

With reference to FIG. 7, the present disclosure relates to a method for configuring a waveguide interface arrangement

1, 1' used for electrically connecting a waveguide device 2 to a microwave conductor 3 in a printed circuit board 4 (PCB) having a PCB dielectric layer 5 with first PCB main side 6 and a second PCB main side 8. The first PCB main side 6 is used for attachment of a waveguide device 2, where the method comprises Step S100 of providing a first PCB metallization 7 at the first PCB main side 6 and a first PCB aperture 10 in the first PCB metallization 7, where the first PCB aperture 10 is adapted to correspond to a waveguide aperture 22 and Step S200 of providing a second PCB metallization 9 at the second PCB main side 8 and a second PCB aperture 11 in the second PCB metallization 9. The method further comprises Step S300 of mounting at least one electronic component 12, 13, 14 to a PCB metallization 7, 9, Step S400 of providing a backshort 15, 15' having a backshort dielectric layer 16 with a first backshort main side 17, 23 and a second backshort main side 19, 19' and Step S500 of providing a first backshort metallization 18, 24 at the first backshort main side 17, 23. The method further comprises Step S600 of providing a second backshort metallization 20, 20' at the second backshort main side 19, 19' and a backshort aperture 21, 21' in the second backshort metallization 20, 20', where the backshort metallizations 18, 24; 20, 20' are electrically connected to each other, and the first backshort metallization 18, 24 covers a main part of the first backshort main side 17, 23. The method further comprises Step S700 of attaching the backshort 15, 15' to the second PCB main side 8 such that the second backshort metallization 20, 20' is electrically connected to the second PCB metallization 9, and such that the backshort aperture 21, 21' is adapted to face the second PCB aperture 11.

According to some aspects, at step S700, attaching the backshort 15, 15' to the second PCB main side 8 is performed using a pick-and-place process.

According to some aspects, the dielectric layers 5, 16 are made of the same dielectric material.

According to some aspects, the main sides 6, 8, 17, 23, 19 are parallel to each other.

According to some aspects, the backshort dielectric layer 16 is homogenous and the backshort main sides 17, 19 are arranged opposite to each other.

According to some aspects, the backshort dielectric layer 16' comprises an air-filled cavity 26 that communicates with the backshort aperture 21', and where the cavity 26 is defined by the first backshort main side 23 and cavity walls 29, 30, 31, 32 extending between the first backshort main side 23 and the backshort aperture 21'.

According to some aspects, the backshort metallizations 24, 20 are electrically connected to each other by using at least partly metalized cavity walls 29, 30, 31, 32 extending between the first backshort main side 23 and the backshort aperture 21'.

According to some aspects, the backshort metallizations 18, 24; 20 are electrically connected to each other by using via connections 25.

According to some aspects, the microwave conductor 3 is formed in the first PCB metallization 7.

According to some aspects, the microwave conductor 3 is formed in the second PCB metallization 9 and enters the backshort 15' via an opening 27 in the second backshort metallization 20'.

According to some aspects, the microwave conductor 3 has a radiating element 28 at an end thereof.

According to some aspects, the PCB metallizations 8, 9 are electrically connected by using via connections 33 that circumvent the PCB apertures 10, 11.

According to some aspects, the PCB metallizations 8, 9 are electrically connected by using at least one metalized wall 34 that connects the PCB apertures 10, 11.

According to some aspects, the second backshort metallization 20, 20' is electrically connected to the second PCB metallization 9 by using soldering.

The present disclosure is not limited to the examples described above, but may vary freely within the scope of the appended claims. For example, for all examples, the microwave conductor 3 can be positioned/implemented in any PCB metallization 7, 9 and either pass through an opening 27 in the second backshort metallization 20' or through an opening 35 in the waveguide device 2. The metallization may be in the form of copper foils which are attached to the dielectric layer 5, 16, 16' in a conventional manner and etched away where applicable. Screen printing and other means of applying metalized structures are of course also conceivable.

The dielectric layers 5, 16, 16' are preferably made of the same dielectric material, but could be made by different dielectric layers, for example due to minimizing losses. In any case, the dielectric materials of the dielectric layers 5, 16, 16' should preferably have at least similar thermal properties regarding expansion and retraction. This enables soldering or electrical conducting glue to be used as the interface between the backshort 15, 15' and the PCB 4.

Two examples have been presented where the backshort either is formed in a homogenous backshort dielectric layer 16 such that a cavity is defined in the dielectric layer 16 by means of delimiting via connections 25 and the first backshort metallization 18, or by an air-filled part in the backshort dielectric layer 16'.

In the former case, according to the first example, there is a via fence between the backshort metallizations 18, 20, and such a backshort 15 can easily be implemented in a PCB production process and therefore be very inexpensive. Another advantage will be that the size of the backshort 15 will be relatively small since the physical dimensions will shrink with the dielectric constant of the dielectric material used for the backshort 15.

In the latter case, according to the second example, the air-filled part is electrically delimited by via connections and the first backshort metallization 24, or by metalized cavity walls 29, 30, 31, 32 and the first backshort metallization 24. According to some aspects, the cavity could be completely or partly filled with another dielectric material, allowing the cavity to be designed with desired dielectric and loss properties.

By means of the present disclosure there is provided a low cost high performance solution for a waveguide interface arrangement that minimizes reliability problems. One advantage is that a potential leakage path that normally is very hard to cope with can be avoided. Thereto, the production process will be simplified since the backshort can be mounted in a standard SMD process without screws and springs. Overall, the cost for the backshort will be reduced significantly.

The invention claimed is:

1. A waveguide interface arrangement arranged for electrically connecting a waveguide device to a microwave conductor, where the microwave conductor is positioned in a printed circuit board (PCB), where the PCB is comprising a PCB dielectric layer, a first PCB main side with a first PCB metallization and a first PCB aperture in the first PCB metallization, and a second PCB main side with a second PCB metallization and a second PCB aperture in the second PCB metallization, where at least one electronic component is mounted to the first PCB metallization, where the first PCB main side is adapted for attachment of the waveguide device, the first PCB aperture being adapted to correspond to an aperture of the waveguide, and where the waveguide interface arrangement comprises a backshort that is attached to the second PCB main side, wherein the backshort comprises a backshort dielectric layer, a first backshort main side with a first backshort metallization, and a second backshort main side with a second backshort metallization and a backshort aperture in the second backshort metallization where:

the first and second backshort metallizations are electrically connected to each other, the first backshort metallization covers a main part of the first backshort main side, the second backshort metallization is electrically connected to the second PCB metallization, and where the backshort aperture is adapted to face the second PCB aperture, wherein the PCB dielectric layer and the backshort dielectric layer are made of same material to reduce thermal mismatches in the waveguide interface arrangement.

2. The waveguide interface arrangement according to claim 1, wherein the first and second PCB metallizations are electrically connected by means of at least one metalized wall that connects both the first and second PCB apertures.

3. The waveguide interface arrangement according to claim 1, wherein the first and second PCB metallizations are electrically connected by means of via connections that surround both the first and second PCB apertures.

4. The waveguide interface arrangement according to claim 1, wherein the microwave conductor is formed in the second PCB metallization and is adapted to enter the backshort via an opening in the second backshort metallization.

5. The waveguide interface arrangement according to claim 1, wherein the backshort dielectric layer comprises an air-filled cavity that communicates with the backshort aperture, and where the cavity is defined by the first backshort main side and cavity walls, that are extending between the first backshort main side and the backshort aperture.

6. The waveguide interface arrangement according to claim 5, wherein the first and second backshort metallizations are electrically connected to each other by the cavity walls being at least partly metalized and extending between the first backshort main side and the backshort aperture.

7. The waveguide interface arrangement according to claim 5, wherein the first and second backshort metallizations are electrically connected to each other by means of partly metallized cavity walls.

8. The waveguide interface arrangement according to claim 1, wherein the microwave conductor is formed in the first PCB metallization.

9. A backshort adapted to be attached to a printed circuit board (PCB), on a second main side of the PCB opposite a first main side of the PCB where a waveguide device is adapted to be mounted, wherein the backshort comprises a backshort dielectric layer, a first backshort main side with a first backshort metallization and a second backshort main side with a second backshort metallization and a backshort aperture in the second backshort metallization, where the first and second backshort metallizations are electrically connected to each other and where the first backshort metallization covers a main part of the first backshort main side, wherein the PCB further comprises a dielectric layer composed of the same material as the backshort dielectric layer to reduce thermal mismatches in the waveguide interface arrangement.

10. The backshort according to claim 9, wherein the first and second backshort metallizations are electrically connected to each other by means of via connections.

11. The backshort according to claim 9, wherein the backshort dielectric layer comprises an air-filled cavity that communicates with the backshort aperture, and where the cavity is defined by the first backshort main side and cavity walls, that are extending between the first backshort main side and the backshort aperture.

12. The backshort according to claim 11, wherein the first and second backshort metallizations are electrically connected to each other by the cavity walls being at least partly metalized and extending between the first backshort main side and the backshort aperture.

13. A method for configuring a waveguide interface arrangement used for electrically connecting a waveguide device to a microwave conductor in a printed circuit board (PCB), where the PCB including a PCB dielectric layer with a first PCB main side and a second PCB main side, where the first PCB main side is used for attachment of a waveguide device, where the method comprises:

providing a first PCB metallization at the first PCB main side and a first PCB aperture in the first PCB metallization, where the first PCB aperture is adapted to correspond to a waveguide aperture of the waveguide device;

providing a second PCB metallization at the second PCB main side and a second PCB aperture in the second PCB metallization;

mounting at least one electronic component to the first PCB metallization;

providing a backshort having a backshort dielectric layer with a first backshort main side and a second backshort main side;

providing a first backshort metallization at the first backshort main side; and providing a second backshort metallization at the second backshort main side and a second backshort aperture in the second backshort metallization;

where the first and second backshort metallizations are electrically connected to each other, and the first backshort metallization covers a main part of the first backshort main side, where the method further comprises attaching the backshort to the second PCB main side such that the second backshort metallization is electrically connected to the second PCB metallization, and such that the second backshort aperture is adapted to face the second PCB aperture, wherein the PCB dielectric layer and the backshort dielectric layer are made of same material to reduce thermal mismatches in the waveguide interface arrangement.

14. The method according to claim 13, wherein the first and second PCB metallizations are electrically connected by using via connections that surround both the first and second PCB apertures.

15. The method according to claim 13, wherein the first and second PCB metallizations are electrically connected by using at least one metalized wall that connects both the first and second PCB apertures.

16. The method according to claim 13, wherein the backshort dielectric layer comprises an air-filled cavity that communicates with the second backshort aperture, and where the cavity is defined by the first backshort main side and cavity walls, that are extending between the first backshort main side and the backshort aperture.

17. The method according to claim 16, wherein the first and second backshort metallizations are electrically connected to each other by the cavity walls being at least partly metalized and extending between the first backshort main side and the backshort aperture.

18. The method according to claim 13, wherein the first and second backshort metallizations are electrically connected to each other by using via connections.

19. The method according to claim 13, wherein the microwave conductor is formed in the first PCB metallization.

20. The method according to claim 13, wherein the microwave conductor is formed in the second PCB metallization and enters the backshort via an opening in the second backshort metallization.

* * * * *